United States Patent [19]
Staudte

[11] 3,969,640
[45] July 13, 1976

[54] MICRORESONATOR PACKAGING AND TUNING

[75] Inventor: Juergen H. Staudte, Anaheim, Calif.

[73] Assignee: Statek Corporation, Orange, Calif.

[22] Filed: Aug. 1, 1973

[21] Appl. No.: 384,402

Related U.S. Application Data
[62] Division of Ser. No. 237,132, March 22, 1972, Pat. No. 3,766,616.

[52] U.S. Cl............................. 310/9.1; 310/8.2; 310/8.1; 317/249 R
[51] Int. Cl.² ............................................. H01R 41/04
[58] Field of Search ............... 310/8, 8.2, 8.9, 9.1, 310/9.3, 9.4, 9.8; 58/23 TF; 331/116 R; 317/249 R

[56] References Cited
UNITED STATES PATENTS

| | | | |
|---|---|---|---|
| 2,954,490 | 9/1960 | Warner et al.......................... | 310/9.1 |
| 3,008,060 | 11/1961 | Mann et al........................... | 310/9.4 X |
| 3,162,780 | 12/1964 | Dalen et al. ......................... | 310/9.4 X |
| 3,697,766 | 10/1972 | Ganter................................. | 310/9.4 X |
| 3,697,789 | 10/1972 | Kato .................................... | 310/8.2 X |
| 3,737,805 | 6/1973 | Shimodira et al............... | 317/249 R |
| 3,754,152 | 8/1973 | Koehler et al. .................. | 317/249 R |

*Primary Examiner*—Mark O. Budd
*Attorney, Agent, or Firm*—Philip M. Hinderstein

[57] ABSTRACT

A piezoelectric tuning fork microresonator advantageously is mounted in a package having a transparent region through which the microresonator can be tuned using a laser beam selectively to remove portions of weights provided on the tuning fork tine ends. The laser, located external to the package, may be controlled automatically in response to the output of an oscillator circuit using the microresonator as a frequency standard. The package also may house electronic microcircuitry and may include a capacitor using the package wall as a dielectric. When used with the microresonator in an oscillator circuit, the capacitor enables the frequency to be adjusted slightly by shorting together capacitor plate sections on the outside of the package. A batch fabrication technique is disclosed for automatically assembling many such packages on a single scored, optionally transparent substrate.

3 Claims, 15 Drawing Figures

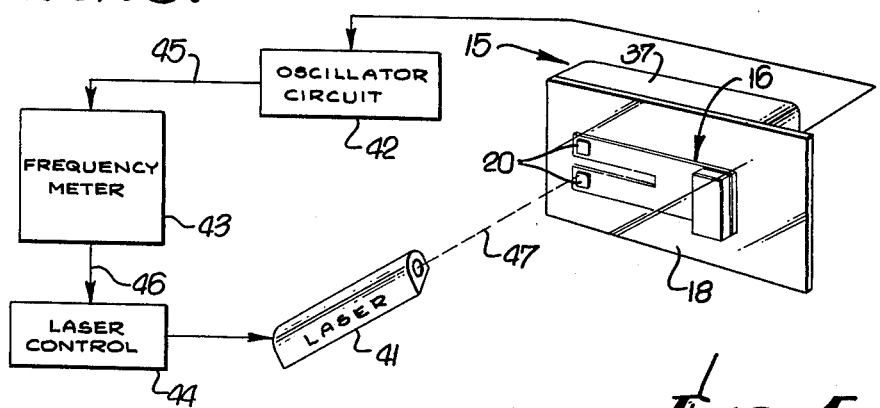
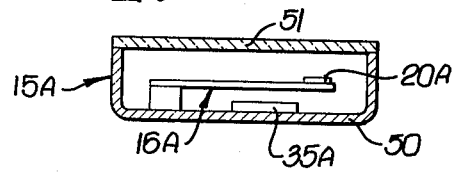
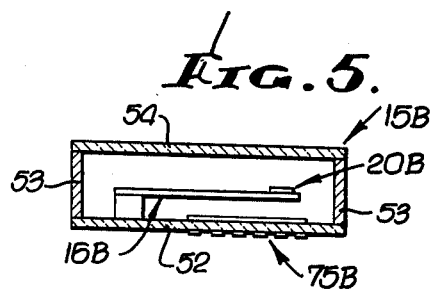
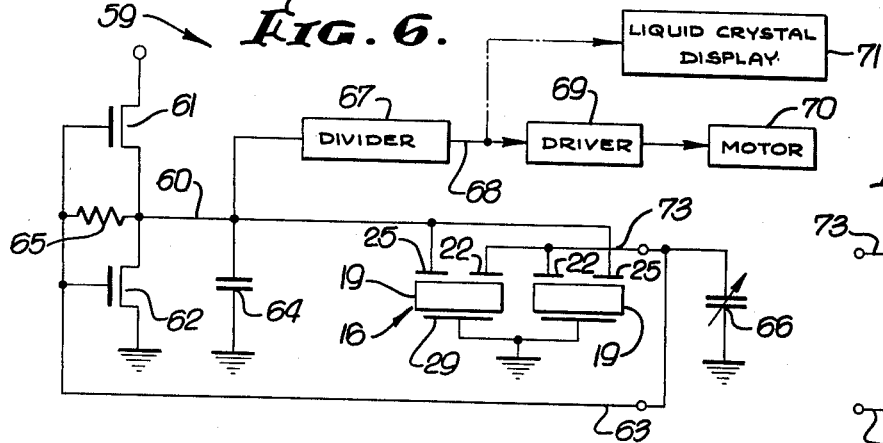
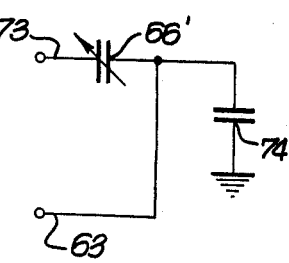
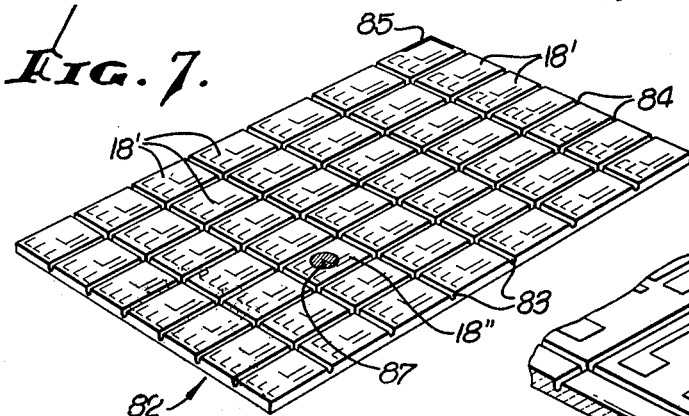
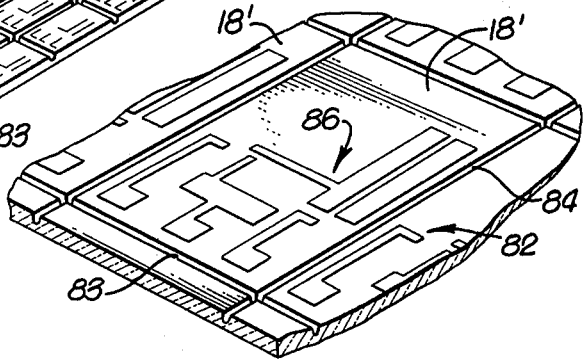

MICRORESONATOR PACKAGING AND TUNING

This is a division of application Ser. No. 237,132, filed Mar. 22, 1972 now U.S. Pat. No. 3,766,616 issued Oct. 23, 1973.

BACKGROUND OF THE INVENTION

1. Field of the Invention

The present invention relates to microresonator packaging and tuning.

2. Description of the Prior Art

Microresonators of tuning fork configuration are disclosed in the inventor's copending U.S. application Ser. No. 122,313 now U.S. Pat. No. 3,683,213. The microresonators are fabricated of piezoelectric or ferroelectric material and have an overall length of from about 100 mils to 500 mils, an overall width of from about 15 mils to 50 mils, and a thickness of less than about 3 mils. Use of the tuning fork structure permits simple pedestal mounting. Typically, the oscillation frequency of these microresonators is in the frequency range of 10 kHz to 100 kHz with stabilities of 0 to 10 parts per million per degree centigrade.

Microresonators of the type described advantageously are employed as the time standard of a watch or clock. The small size permits the microresonator to be housed together with microelectronic oscillator, frequency divider and driver circuitry in a package sufficiently small to fit in a ladies wristwatch. The microresonators also are applicable in tone telemetry as for automatic meter reading, in filters for paging systems, and as time standards for data transmission systems, calculators and the like.

Microlithographic techniques useful for microresonator batch fabrication are described in the above mentioned U.S. patent application. One object of the present invention is to provide methods for packaging such microresonators on a mass production basis.

Although microresonators can be batch fabricated to frequencies relatively close to a desired value, it is necessary to tune each microresonator individually to obtain an exact frequency. Tuning is facilitated by providing on each tuning fork tine a thick metal film weight. Excess thick film material is removed, as by a laser, to achieve the desired mass and hence microresonator frequency. Another object of the present invention is to provide a technique for automatically accomplishing such tuning.

The microresonator frequency may change slightly during the packaging process as a result, e.g., of the heating required to bond the pedestal to a substrate or to complete hermetic sealing of the package. Mechanisms such as lattice dislocations may cause the stiffness of the piezoelectric material to increase over a period of time, with concomitant increase in microresonator frequency. Pre-aging of the tuning fork during manufacture minimizes subsequent frequency variation. These factors make it preferable to carry out the individual microresonator tuning after packaging and pre-aging have been completed. To this end, a further object of the present invention is to provide a housing which permits tuning of the microresonator after other production steps have been completed.

A microresonator used as the time standard in a wristwatch may increase in frequency slightly over an extended period of months or years. It is desirable to provide simple means for correcting this frequency deviations without modifying the tuning fork weights or replacing the microresonator itself. The necessary fine tuning can be accomplished by adjusting the value of a capacitor included in an oscillator circuit using the microresonator as a frequency source. Another object of the present invention is to provide a capacitor of novel configuration which uses the microresonator package as the capacitor dielectric, and which permits correction of the oscillator frequency by a simple operation performed external to the package.

SUMMARY OF THE INVENTION

These objectives are accomplished by providing a microresonator package characterized in that a portion of the package is transparent with the microresonator mounted so that the thick film weights can be trimmed using a laser beam projected through the transparent region. Preferably the laser is controlled automatically in response to the output of an oscillator circuit using the microresonator as a frequency source. In this way the microresonator is tuned while in actual operation and after packaging has been completed.

In a preferred embodiment the package comprises a transparent glass substrate to which the microresonator pedestal is bonded. Optionally the substrate may be provided with thin film electrical conductors, may support electronic microcircuitry, and/or may function as the dielectric for a capacitor having thin film plates on opposite substrate surfaces.

The capacitor plate on the substrate outside surface may be segmented to permit fine frequency adjustment of an oscillator employing the microresonator and the capacitor.

A lid is sealed hermetically to the substrate to cover the microresonator and other components. The frequency adjustment weights are situated on the underside of the microresonator so as to be visible through the substrate for laser tuning. Alternatively, the top or other portion of the package may be transparent, with the tuning fork weights appropriately situated for laser beam accessibility.

Batch fabrication of the microresonator packages begins with a sheet of glass or other substrate material scribed to define a matrix of individual package substrates. Thin film circuitry including the capacitor plates is deposited simultaneously on all segments, followed by attachment and interconnection of the microresonators. The package covers then may be mounted using an epoxy or other material to form a hermetic seal. The packages are tested automatically and pre-aged prior to individual laser tuning of each microresonator through the transparent substrate sheet. Finally the substrate sheet is segmented along the score lines to separate the packages.

BRIEF DESCRIPTION OF THE DRAWINGS

A detailed description of the invention will be made with reference to the accompanying drawings wherein like numerals designate corresponding parts in the several figures.

FIG. 3 is a diagrammatic view illustrating automatic laser tuning of a packaged microresonator.

FIGS. 4 and 5 are transverse sectional views of alternative microresonator packages in accordance with the present invention.

FIG. 6 is an electrical diagram of a typical oscillator circuit using a microresonator as the frequency source and incorporating capacitive fine tuning.

FIG. 6A shows an alternative capacitive fine tuning configuration for the oscillator of FIG. 6.

FIGS. 7 through 10 illustrate batch assembly of microresonator packages of the type shown in FIG. 1. Specifically, FIG. 7 shows a sheet of material scored to define a matrix of package substrates, one of which is shown in enlarged form in FIG. 8; FIG. 9 shows the same substrate segment after component attachment; and FIG. 10 shows covers in place on the substrate segments.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention since the scope of the invention is best defined by the appended claims.

Structural and operational characteristics attributed to forms of the invention first described shall also be attributed to forms later described, unless such characteristics are obviously inapplicable or unless specific exception is made.

Figure 1:
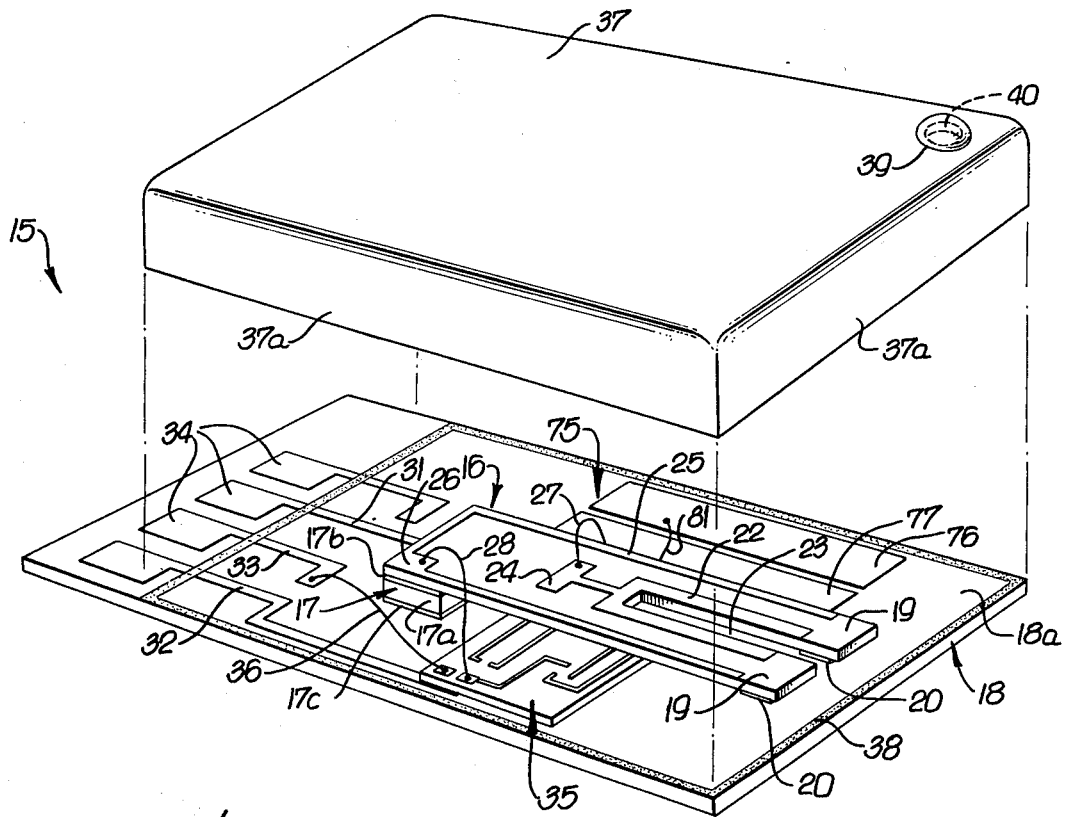
FIG. 1 is a greatly enlarged perspective view of a microresonator package in accordance with the present invention; for clarity the cover is shown separated from the substrate.
Figure 2:
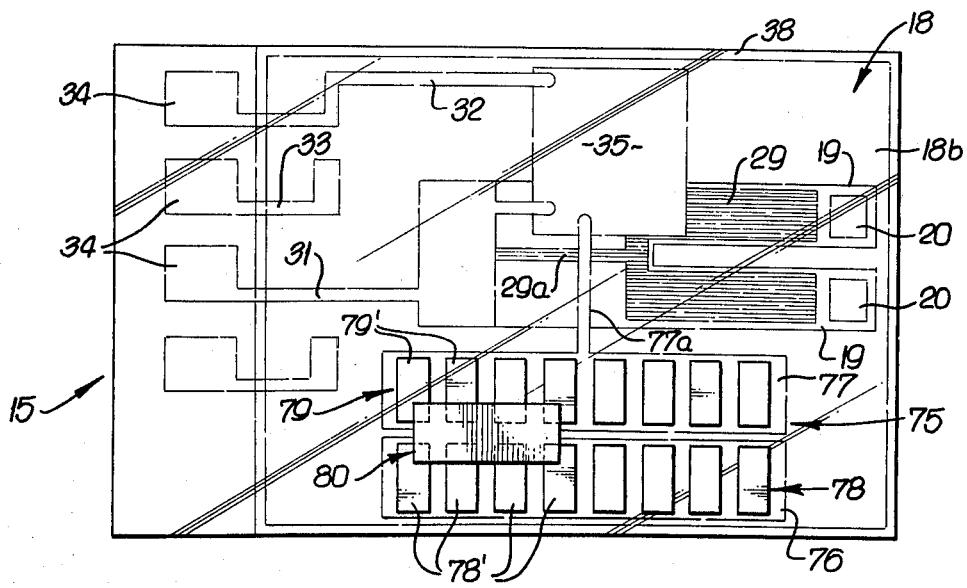
FIG. 2 is a bottom view of the package of FIG. 1.

In FIGS. 1 and 2 there is shown a package 15 containing a microresonator 16 of the type described in the above mentioned U.S. patent application. The microresonator 16 is of tuning fork configuration and is mounted by a pedestal 17 to a transparent substrate 18 of glass or like material.

The underside of each tuning fork tine 19 has a metal film weight 20 formed thereon, as by vacuum deposition during fabrication of the microresonator 16. The metal film weights 20 typically are on the order of 1 micron thick, and thus may be designated "thick films." The weights 20 are visible through the transparent substrate 18 to allow laser tuning as shown in FIG. 3. The laser beam projects through the substrate 18 to remove excess thick film material, thereby decreasing the mass of the weights 20 and increasing the microresonator 16 frequency to a desired value. The microresonator 16 may be fabricated of quartz with the tines 19 oriented parallel to the Y axis of the crystal. Preferably the crystal is cut at an angle of plates 45° to 70° rotation about the Y axis, with up to about 8½° rotation about the X' axis. As noted earlier, no dimension of the microresonator 16 is greater than about 500 mils, and generally the overall length will be less than this value. The size of the substrate 18 is correspondingly small. For a typical microresonator 16 having a length of about 250 mils, the substrate 18 may be about 200 mils wide and 300 mils long. Of course the exact dimensions will depend on the frequency and hence size of the microresonator 16 and on the number and size of the other components contained in the housing 15.

In the embodiment of FIGS. 1 and 2, the microresonator 16 has on its upper surface a first thin film electrode 22 extending along the edges of the tuning fork slot 23 and terminating at a pad 24. Another thin film electrode 25 extends along the outer edge of each tuning fork tine 19 and terminates at a pad 26. Wires 27, 28 bonded to the pads 24, 26 provide electrical connection to the respective electrodes 22, 25. A thin film electrode 29 (FIG. 2) extends across substantially the entire width of both tines 19 on the underside thereof. The electrode 29 may include a conductive segment 29a to facilitate interconnection to other circuitry via the pedestal 17. The pedestal 17 itself may comprise a metal preform 17a attached to the microresonator 16 and to the substrate 18 by respective conductive epoxy layers 17b and 17c. A thin film conductor 31 formed on the substrate upper surface 18a completes the interconnection path.

Other thin film conductors 32, 33 may be provided on the substrate surface 18a. The conductors 31, 32, 33 terminates at respective pads 34 which receive external electrical connections to the package 15.

A conventional integrated circuit 35 mounted on the substrate 18 may include oscillator, operational amplifier, divider or other circuitry useful in conjunction with the microresonator 16. In the example of FIG. 1 electrical connection to the microcircuit 35 is made via the wires 28, 36 and the conductor 32. To conserve space, part or all of the microcircuit 35 may be situated beneath the microresonator 16, care being taken not to obscure the weights 20 from external view.

A cover 37 completes the package 15. The bottom edges of the cover side walls 37a are bonded to the substrate 18 by an epoxy or other adhesive 38 to provide a hermetic seal. A plug 39 covers a hole 40 which, as described below, permits the escape of volatiles during assembly of the package 15. The conductors 31, 32 33 extend through the seal 38 so that the pads 34 are not covered by the lid 37.

FIG. 3 illustrates the manner in which a microresonator 16 mounted within a package 15 may be tuned automatically using a laser 41. The microresonator 16 is interconnected to function as the frequency source in an oscillator circuit 42. This circuitry may be contained within the package 15, as on the microcircuit 35, or may be external to the microresonator housing. The oscillation frequency of the circuit 42 is ascertained by a frequency meter 43 which provides appropriate signals to a laser control unit 44. With the microresonator 16 in operation, the circuit 42 will provide an output signal on a line 45 at a frequency determined in part by the mass of the weights 20. Initially this frequency will be lower than the desired value; accordingly, the frequency meter 43 will provide a signal on a line 46 causing the laser control unit 44 to turn on the laser 41. The laser beam 47 projects through the transparent substrate 18 to evaporate a portion of the weights 20. As a result, the oscillation frequency will increase, eventually reaching the desired value. When this occurs, the frequency meter 43 will cause the laser control unit 44 to turn off the laser 41. The microresonator 16 will then be tuned exactly to the desired frequency. The tuning operation of FIG. 3 is carried out with the microresonator 16 in actual operation.

The laser control unit 44 may direct the laser 41 to scan across the weights 20 so that material is removed over a linear region rather than from one point. Alternatively, a raster or other scan pattern may be used.

Figure 13:
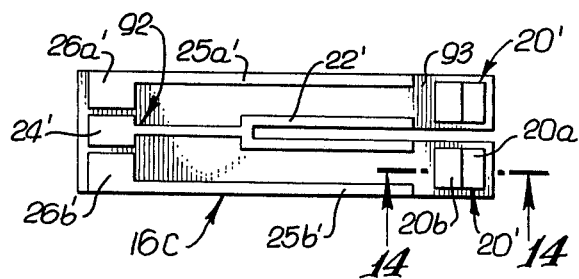
FIG. 13 is a bottom view of a microresonator adapted for mounting on the substrate of FIG. 11.
Figure 14:
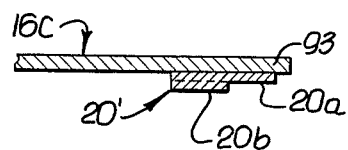
FIG. 14 is a transverse view of a microresonator tine, as viewed along the line 14—14 of FIG. 13, illustrating tuning fork weights having different thicknesses for coarse and fine laser tuning.

To facilitate coarse and fine laser tuning, the microresonator weights may be configured as shown in FIGS. 13 and 14. There each weight 20' includes a region 20a of one thickness (e.g., 1500 A) and a second, thicker region 20b (e.g., 1 micron). The weights 20' may be formed by initially evaporating a thin film of gold or other metal on each tine 19. Electroformed gold then may be deposited only in the region 20b to provide the greater thickness.

Laser evaporation of a certain area of the region 20b will cause a greater change in frequency than evaporation of a like area of the region 20a. Thus if the microresonator frequency is relatively far from the desired value, the frequency meter 43 may direct the laser control unit 44 to aim the laser beam toward the thick region 20b. If the frequency is relatively close to the desired value, the control unit 44 will cause laser evaporation in the region 20a.

Although automatically controlled laser tuning is illustrated in FIG. 3, this is not a requirement of the invention; laser tuning may be under manual control. Further, the entire substrate 18 need not be transparent; the substrate 18 could be opaque, with an appropriate window exposing only the weights 20. Such arrangement also may prevent inadvertent laser damage to other components in the package 15.

FIGS. 4 and 5 show alternative microresonator packages 15A and 15B in accordance with the present invention. In the package 15A a cup-shaped, opaque member 50 supports the microresonator 16A and other components such as a microcircuit 35A. A transparent cover 51 is bonded to the member 50 to enclose hermetically the resonator 16A. To facilitate laser tuning through the cover 51, the tuning fork weights 20A are formed on the upper surface of the microresonator 16A. In the embodiment of FIG. 5, the package 15B includes a planar substrate 52, an annular side wall 53 and a planar, transparent cover 54. Again the weights 20B are situated on the top of the microresonator 16B to permit laser tuning through the cover 54. Alternatively, the substrate 52 could be transparent with the weights situated on the underside of the microresonator 16B.

A typical oscillator circuit 59 employing the microresonator 16 is shown in FIG. 6. The outer tine electrodes 25 are driven by a signal derived at the common connection 60 of a pair of complementary metal oxide semiconductor (CMOS) transistors 61, 62. The microresonator output signal derived at the inner tine electrode 22 is provided via a line 63 to the gates of both transistors 61, 62. A capacitor 64 of value greater than the effective capacitance of the microresonator 16 shunts the output of the transistor circuit. A relatively large resistance 65 provides feedback to obtain linear operation. A variable capacitor 66 permits fine tuning of the oscillator frequency, and is connected to the tine electrode 22.

The electric field developed between the electrodes 25 and 29 causes oscillation of the microresonator 16, producing an output signal at the electrode 22. This signal is amplified by the transistors 61, 62 and fed back to the electrode 25 in appropriate phase so as to maintain oscillation.

The oscillator output is derived at the junction 60, and may be supplied to a divider circuit 67 to obtain a lower frequency signal on a line 68. In a very simple wristwatch configuration, the oscillator frequency and number of divider stages may be selected to produce a one pulse per second signal on the line 68. This signal may be amplified by a driver circuit 69 and supplied to a stepping motor 70 which mechanically advances the wristwatch hands. Alternatively, the output on the line 68 may be used to drive a liquid crystal or other display 71 to exhibit the tine numerically.

An alternative capacitor arrangement is shown in FIG. 6A. There, the variable capacitor 66' is connected via a line 73 between the electrode 22 and the line 63 to the transistor 61, 62 gates. A fixed capacitor 74 of value greater than the effective capacitance of the microresonator 16 shunts the gate input circuit.

The capacitor 66 or 66' provides fine frequency adjustment for the oscillator circuit 59, and thus may be used for critical speed adjustment of a watch or clock using the microresonator 16 as a time standard. Shown in FIGS. 1 and 2 is a unique capacitor structure 75 which may be employed advantageously as the capacitor 66 or 66'. The capacitor 75 uses the substrate 18 as a dielectric, is electrically connected within the package 15, and is adjustable on the outside of the package 15.

The capacitor 75 includes a spaced parallel pair of generally rectangular thin film plates 76, 77 deposited on the upper substrate surface 18a. Electrical connections are made to these plates 76, 77 as via a wire 81 and a thin film conductive segment 77a. Disposed on the outside surface 18b (FIG. 2) are a first plurality of thin film, electrically conductive segments 78 situated on the same substrate 18 region as the inside capacitor plate 76. Similarly, a second set of conductive segments 79 is formed on the surface 18b in the same region as the capacitor plate 77.

The conductive segments 78 and 79 are used for adjustment of capacitance. To this end, a strip of electrically conductive, adhesive tape 80 (FIG. 2) is used to short together certain of the segments 78, 79. The interconnected segments 78' and 79' together form a common, electrically floating plate for the capacitor 75; the number of shorted segments 78, 79 establishes the effective capacitance. Each segment 78, 79 may be very small (e.g., as short as 0.5 mils), with sufficient segments being provided to permit smooth, fine adjustment of capacitance. A capacitor 75 having a capacitance in the range of about 0.1 to 2 pf is sufficient for fine frequency adjustment in the circuit 59. When a signal is applied to the capacitor 75 via the leads 81, 77a an electric field results between the plate 76 and the interconnected segments 78' and thence between the segments 79' an the other capacitor plate 77.

The capacitor structure 75 may be used as the capacitor 66 or 66' in the circuit 59, or as an adjustable component in another oscillator circuit employing the microresonator 16 as a frequency source. In such instance, fine frequency adjustment is accomplished by shorting together a fewer or greater number of the segments 78 and 79. Such adjustment is achieved external to the package 15 without the need for retrimming the weights 20 or otherwise affecting components inside of the package 15.

Methods other than the use of a conductive tape 80 may be used selectively to short the segments 78, 79. For example, these segments initially could be interconnected by narrow thin film conductors, ones of which are scraped away to disconnect certain segments 78, 79. The capacitor 75 need not be formed on the transparent portion of the package 15 but, as shown in FIG. 5, a like capacitor 75B may be formed on an opaque package member 52.

Batch fabrication of microresonator packages 15 is illustrated in FIGS. 7 through 10. Referring thereto, a plurality of packages 15 are formed on a single sheet 82 of glass or other material which is scribed or scored to form a plurality of horizontal grooves 83 and vertical grooves 84. The grooves 83, 84 define a matrix of many substrate segments 18' which can be separated after the packages 15 all have been assembled. Typically the sheet 82 may be on the order of 5 inches square, with a thickness of about 10 mils. Such a sheet 82 may be divided into approximately 416 segments 18' each approximately 300 mils long and 200 mils wide.

Either before or after the substrate 82 has been scored, the various thin film electrodes, pads and capacitor plates (herein generally designated "conductors 86") are formed simultaneously on all of the segments 18' by conventional vacuum deposition or sputtering techniques through an appropriate mask (not shown). The mask may be aligned with reference to a corner 85 or other fiducial mark on the substrate 82. FIG. 8 shows an enlarged region of the substrate 82 subsequently to deposition of the conductive segments 86.

Conventional probing techniques next may be used to verify that the conductors 86 have been deposited properly on all of the segments 18'. For this operation, the sheet 82 may be mounted on an "X-Y table," that is, a jig programmed to move along orthogonal axes to selected locations measured with respect to the corner 85 or other reference mark. A probe lowered onto each segment 18' interconnects the conductors 86 with test equipment to verify that the conductors are not defective. If a flaw is detected, a spot 87 of low reflectivity or magnetic ink is marked on the defective segment 18". The X-Y table may be computer controlled.

As a next step, a epoxy or other adhesive is deposited on each segment 18' in locations appropriate to mount components such as the microresonator 16 and the integrated circuit 35. The components themselves then are placed onto the epoxy by automatic equipment operating in conjunction with the X-Y table. The sheet 82 with all components so mounted then is placed in an oven and heated to cure the adhesive. Next, the various wires 27, 28, 36 and 81 are welded, ultrasonically bonded or otherwise attached to the components, all by automatic equipment positioned relative to the corner 85.

Figure 9:
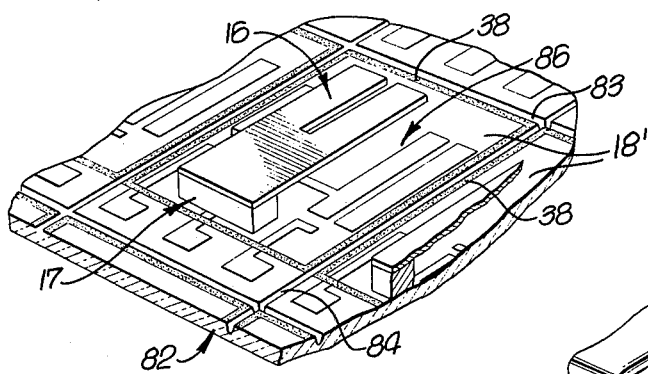
Figure 10:
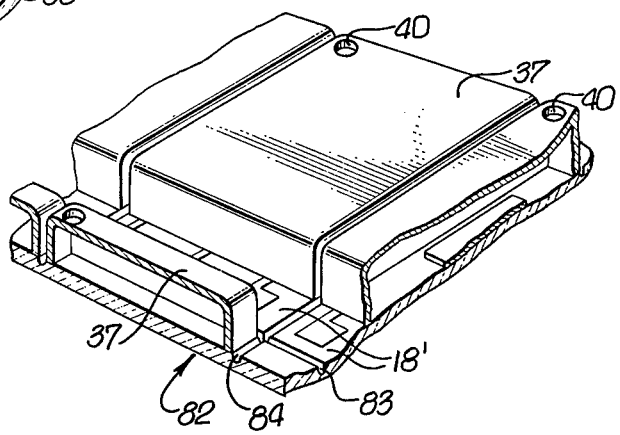

An epoxy or other adhesive is deposited on each segment 18' to form the seal 38 (FIG. 9). Individual covers 37 then are positioned over the sealing adhesive 38, and the entire sheet 82 with all components and covers attached is heated to cure the adhesive 38. Preferably this heating is accomplished under vacuum conditions, so that volatiles released during curing will be evacuated from each package 15 via the hole 40 (FIG. 10) in each cover 37. Next, a solder preform is placed in each hole 40 and the entire structure 82 again heated under vacuum or in an inert atmosphere. This melts the solder to form the plug 39 (FIG. 1), completing hermetic closure of each container 15.

Automatic equipment then is used to test electrically each of the packages 15. During such test the sheet 82 may be situated on an X-Y table, with probes making electrical connection via the pads 34 to the individual packages 15. The entire structure 82 then may be stored at an elevated temperature for some duration of time to pre-age the microresonators 16. Laser apparatus such as that shown in FIG. 3 next is used to tune individually the microresonator 16 in each package 15 on the sheet 82. Finally, the sheet 82 is segmented along the grooves 83, 84 to separate the completely fabricated packages 15.

Figure 11:
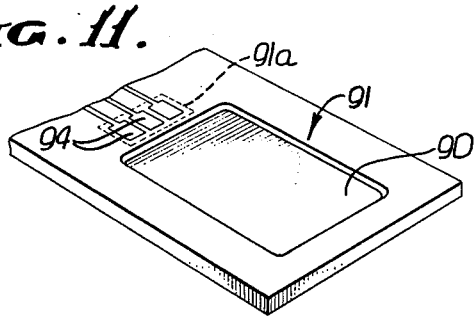
FIGS. 11 and 12 are perspective views of a substrate configured for cantilever mounting of a microresonator over a recess.
Figure 12:
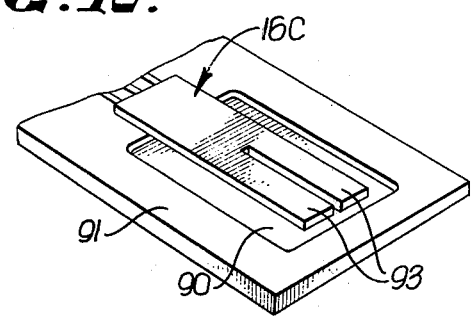

An alternative microresonator mounting arrangement is shown in FIGS. 11 through 13. A recess 90 is formed in a transparent or other substrate 91. The stem 92 of the microresonator 16C is bonded directly to a substrate region 90a so that the tines 93 are cantilevered over the recess 90 (FIG. 12). Thus the region 90a functions as a pedestal for the microresonator 16C.

The tine edge electrodes for the microresonator 16C may be formed on the underside thereof for direct connection to corresponding thin film electrodes and pads 94 on the substrate region 91a. To this end, the slot edge electrode 23' is provided with a pad 24' and the outer edge electrodes 25a', 25b' are provided with respective pads 26a' and 26b'. An electrically conductive epoxy adhesive applied only on the pads 94 makes electrical connection to the electrodes 23', 25a', 25b' and mechanically mounts the microresonator 16C to the substrate 91.

Intending to claim all novel, useful and unobvious features as shown or disclosed, the applicant claims:

1. A package containing a microresonator having a tuning fork configuration including a base portion and two tines extending therefrom, said tuning fork configuration having no dimension greater than 500 mils, each of said tines having metal weights thereon, each of said weights having a first region of one thickness and a second region of lesser thickness, at least a portion of said package being transparent to permit the beam from a laser external to said package to pass therethrough for selective removal of portions of said weights to alter the oscillation frequency of said microresonator, removal of material from said first or second regions, respectively, effecting coarse or fine tuning of said microresonator, said package also containing electronic microcircuitry interconnected to said microresonator, said microcircuitry comprising an oscillator using said microresonator as a frequency source, said package also containing an adjustable capacitor electrically interconnected to affect the frequency of said oscillator, said capacitor including spaced parallel plates, some of said plates being electrically connected within said package and others of said plates being outside of said package, said capacitor utilizing a wall portion of said package as the plate separating dielectric.

2. A package containing a microresonator having a tuning fork configuration including a base portion and two tines extending therefrom, said tuning fork configuration having no dimension greater than 500 mils, each of said tines having metal weights thereon, each of said weights having a first region of one thickness and a second region of lesser thickness, at least a portion of said package being transparent to permit the beam from a laser external to said package to pass therethrough for selective removal of portions of said weights to alter the oscillation frequency of said microresonator, removal of material from said first or second regions, respectively, effecting coarse or fine tuning of said microresonator, one wall of said package having a recess on the inside surface thereof, the stem of said microresonator being mounted to said one wall with the tines cantilevered above said recess.

3. A package according to claim 2, wherein said miroresonator includes thin film electrodes on the undersurface thereof in direct contact with corresponding thin film pads on the inside surface of said one wall adjacent said recess.

* * * * *